United States Patent [19]

Munkberg

[11] 4,230,992

[45] Oct. 28, 1980

[54] REMOTE CONTROL SYSTEM FOR TRAFFIC SIGNAL CONTROL SYSTEM

[75] Inventor: John A. Munkberg, Forest Lake, Minn.

[73] Assignee: Minnesota Mining and Manufacturing Company, Saint Paul, Minn.

[21] Appl. No.: 36,067

[22] Filed: May 4, 1979

Related U.S. Application Data

[62] Division of Ser. No. 803,037, Jun. 3, 1977, Pat. No. 4,162,477.

[51] Int. Cl.[3] .......................................... H03K 5/153

[52] U.S. Cl. .................................. 328/140; 307/232; 307/233 R; 307/269; 328/72; 328/109

[58] Field of Search .................. 328/72, 73, 109, 110, 328/130, 136, 138, 140; 307/232, 233 R, 269

[56] References Cited

U.S. PATENT DOCUMENTS

| | | | |
|---|---|---|---|
| 3,634,869 | 1/1972 | Hsueh | 307/233 X |
| 3,705,358 | 12/1972 | Bauman et al. | 307/232 X |
| 3,995,223 | 11/1976 | Gimber et al. | 307/232 X |
| 4,068,180 | 1/1978 | Nelligan | 307/232 X |

*Primary Examiner*—John Zazworsky

*Attorney, Agent, or Firm*—Cruzan Alexander; Donald M. Sell; Robert L. Marben

[57] ABSTRACT

A multiple priority remote control system for the remote control of a traffic signal control system for a traffic intersection responsive to optical signals transmitted by optical energy transmitters carried on designated vehicles operating along the roadways of the intersection. The remote control system includes signal discriminator circuitry for producing high or low control signals dependent upon the particular optical signal that is detected and in accordance with the roadway of the intersection from which the detected optical signal is received. A control circuit connected to the controller for the traffic signal control system and to the discriminator circuitry responds to the control signals to provide a green light to the vehicle transmitting the first of two detected low priority signals or the first of two detected high priority signals or the high priority signal of detected high and low priority signals. The signal discriminator means includes a signal discriminator circuit which provides a delay and a coincidence circuit for a received signal to detect the high priority signals. A signal cancel counter and reset signal circuit is included in the signal discriminator circuit for enhancing the degree of signal discrimination.

3 Claims, 4 Drawing Figures

REMOTE CONTROL SYSTEM FOR TRAFFIC SIGNAL CONTROL SYSTEM

This is a division of application Ser. No. 803,037 filed June 3, 1977, now U.S. Pat. No. 4,162,477.

BACKGROUND OF THE INVENTION

1. Field of the Invention

The invention presented herein relates to a signal discriminator circuit for providing a control signal only in response to a consecutive predetermined number of input signals presented at a predetermined frequency, the signal discriminator circuit being particularly useful in a remote control system for a traffic signal control system which provides remote control in response to either of at least two possible signals with the response to one of the signals providing priority control of the traffic signal control system.

2. Description of the Prior Art

Traffic signal remote control systems are currently in use which utilize an optical energy emitter that is mounted on a selected vehicle, such as a police vehicle or ambulance, for the transmission of optical energy pulses that occur at regular intervals and are directed toward an intersection as the vehicle approaches the intersection. The optical transmissions are detected by a directional optical detector that is mounted in the vicinity of the intersection. The detected signal is applied to a signal recognition or discriminator circuit which produces a control signal at its output if the detected signal satisfies the qualifications imposed on the input signal by the discriminator circuit. The output signal from the discriminator is applied to the controller of the traffic signal control system via appropriate circuitry connected to the controller to cause a green light to be presented at the traffic light face for the optical signal transmitting vehicle allowing it to pass through an intersection in a normal manner.

It is desirable that a traffic signal remote control system be provided wherein remote control of the traffic signal control system is carried out on a multiple priority basis. For example, if a vehicle, designated as a low priority vehicle, were to approach an intersection and emit a light energy signal for causing the traffic light controller to provide a green light to the vehicle and, subsequently, a vehicle, designated as a high priority vehicle, were to approach the intersection on a conflicting path, it would be desirable that an optical energy signal transmitted from the high priority vehicle would cause the system to over-ride the action initiated by the low priority vehicle to cause a green light to be provided to the high priority vehicle permitting it to pass through the intersection before the low priority vehicle.

The desired multiple priority remote control system is attained by the use of the signal discriminator circuit in accordance with the present invention which provides a control signal from pulses obtained from optical energy signals of only a particular repetition frequency and excludes other optical energy signals that may be detected by the optical detector.

SUMMARY OF THE INVENTION

The invention presented herein provides a signal discriminator circuit that is useful in a multiple priority remote control system for the remote control of a traffic signal control system of the type in which a controller controls the red, yellow and green traffic signal lights at a traffic intersection defined by at least two intersecting roadways, such remote control system using at least two different optical energy signals transmitted by optical energy transmitters carried by designated vehicles operating along the roadways of the intersection. The remote control system includes a first detector means for the intersection for detecting the optical energy signals transmitted by the optical energy transmitters approaching the intersection along one roadway for the intersection; a second detector means for the intersection for detecting the optical energy signals transmitted by the optical energy transmitters approaching the intersection along another roadway for the intersection; a signal discriminator means operatively connected to said first and second detector means for providing first, second, third and fourth control signals, the first control signal being provided in response to detection by the first detector means of at least one of the optical energy signals, the second control signal being provided in response to detection by the first detector means of a predetermined one of the possible optical energy signals, the third control signal being provided in response to detection by the second detector means of at least one of the optical energy signals, the fourth control signal being provided in response to detection by the second detector means of a predetermined one of the possible optical energy signals. The remote control system also includes a control circuit operatively connected to the controller, the signal discriminator means and the green light circuits of the traffic signal lights for each roadway of the intersection. The control circuit responds to the initial one of the control signals that is presented to cause the controller to present the green light associated with such initial control signal. The control circuit also responds to the fourth control signal, when presented subsequent to presentment of the first control signal as the initial control signal. The control circuit responds to the fourth control signal to provide priority control of said controller for presenting the green light associated with said fourth control signal. Similarly, the control circuit also responds to the second control signal to provide priority control of said controller for presenting the green light associated with the second control signal when the second control signal is presented subsequent to presentment of the third control signal as the initial control signal.

This invention provides a signal discriminator circuit that is useful in the signal discriminator means for providing a control signal in response to detection of a predetermined one of the possible optical energy signals. Such a discriminator circuit uses a delay circuit in conjunction with an input synchronizing circuit, each of which are controlled by a multiphase non-overlapping timing pulse generator. The input synchronizing circuit also receives pulses that are derived from detected optical energy signals to provide synchronized pulses which are applied to the delay circuit and to a coincidence circuit. The delayed pulses are applied to a coincidence circuit along with pulses from the synchronizing circuit. If coincidence occurs between a delayed pulse and a pulse from the synchronizing circuit, such pulses can be considered to have originated from the same optical signal transmitter. The discriminator circuit also includes counter circuitry for requiring a predetermined number of consecutive pulses to be received which are identified by such coincidence before a control pulse is provided for a predetermined period of time. The degree of discrimination provided by this arrangement makes it possible to use such a discriminator circuit to obtain a control signal from pulses obtained from optical energy signals that are provided at only a particular repetition frequency and exclude other optical energy signals that may be detected by the optical detector.

The degree of discrimination provided by the discriminating circuit is further enhanced by a signal cancel counter that is operatively connected to the output of the delay circuit, the counter circuitry, and the pulse generator for resetting the counter circuitry in the event the coincidence circuit, when an input signal is received from the delay circuit, fails to provide an output signal within a period of time that is less than the delay time of the delay circuit.

In addition, a reset signal circuit is provided which is operatively connected to the coincidence circuit and the delay circuit and in response to a signal from the coincidence circuit preventing the coincidence circuit from providing another signal at its output for a time period equal to the delay time of the delay circuit which also enhances the degree of discrimination provided by the discriminating circuit. The reset signal circuit is also operatively connected to the signal cancel counter to reset the signal cancel counter when the reset signal circuit receives a signal from the coincidence circuit.

The invention presented herein will be better understood from the following description considered in connection with the accompanying drawings in which an embodiment of the invention is illustrated by way of example. It is to be expressly understood, however, that the drawings are for the purpose of illustration and description only and are not intended as a definition of the limits of the invention.

DETAILED DESCRIPTION

Figure 1:
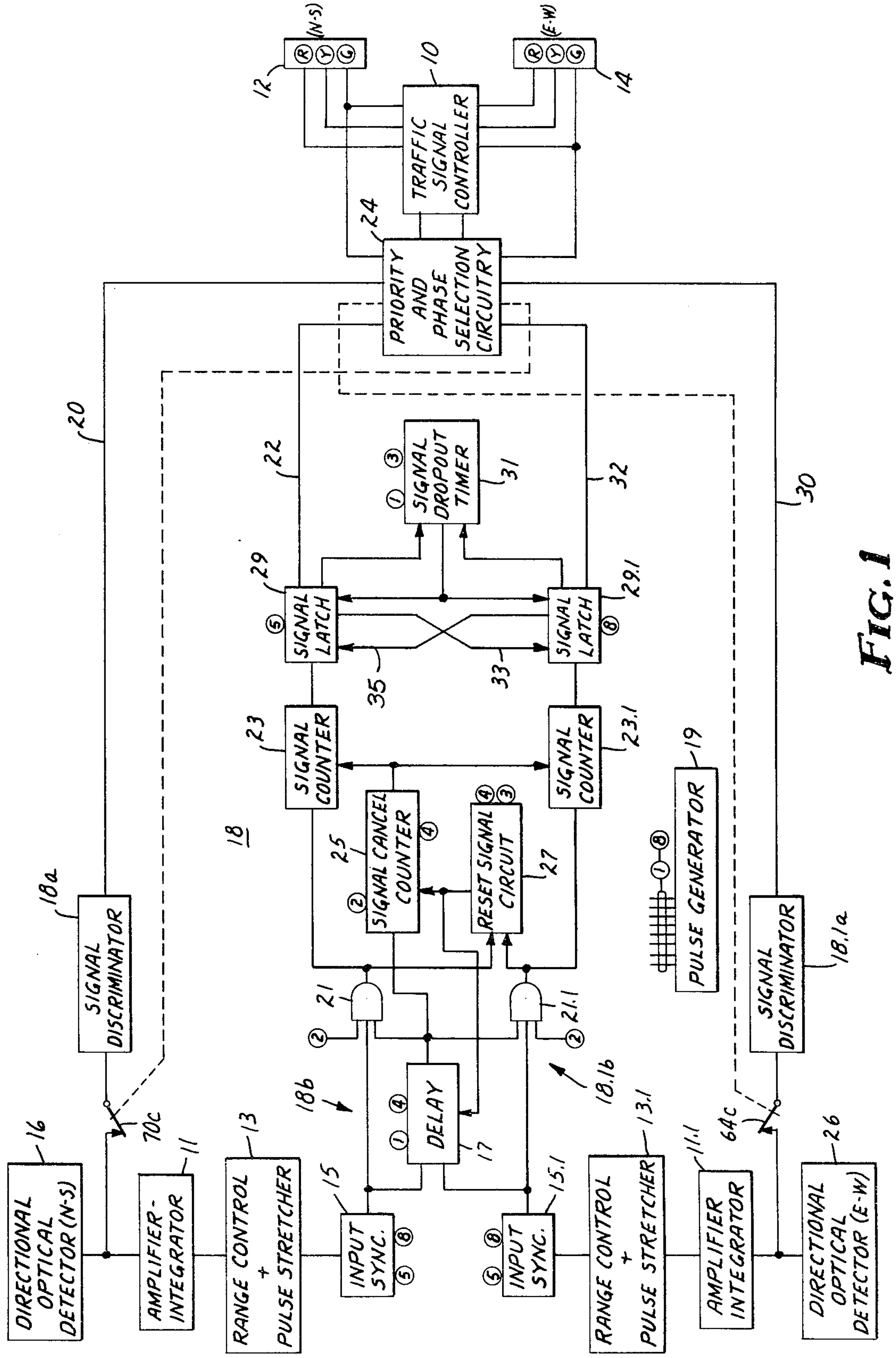
FIG. 1 is a block diagram of an embodiment of the signal discriminator circuit of this invention shown as a part of a multiple priority remote control system for the remote control of a traffic control system.

Referring to FIG. 1, a remote control system for a traffic signal control system embodying signal discriminator circuits **18*b* and 18.1*b* in accordance with the invention is shown in block diagram form with a two-phase traffic light control system for a two roadway intersection used as an exemplary traffic signal control system to illustrate the use of such a remote control system. The traffic signal control system includes a traffic signal controller 10 connected for controlling the traffic lights 12 for the control of traffic along one of the roadways (north-south) for the intersection and connected to the traffic lights 14** for the control of traffic along the other roadway (east-west) of the intersection.

The remote control system portion of FIG. 1 includes an optical detector means shown as a single directional optical detector 16 positioned near the traffic intersection for detecting optical energy signals transmitted from selected vehicles when traveling along the north-south roadway. In some situations, more than one directional optical detector 16 will be required. A signal discriminator means 18 is provided which includes a first discriminator circuit **18*a* and a second discriminator circuit 18*b* which are associated with travel along the north-south roadway of the intersection. The first signal discriminator circuit 18*a* is connected to the detector 16 and provides a first control signal on conductor 20 in response to detection by the detector 16 of any one of at least two different predetermined optical energy signals transmitted from selected vehicles when traveling the north-south roadway of the traffic intersection. The first control signal continues for a predetermined time after the detector 16 ceases to detect the optical energy signals which initiated the control signal. The signal discriminator circuit 18*b* provides a second control signal on conductor 22 in response to detection by the detector 16 of a predetermined one of the possible optical energy signals to be transmitted from selected vehicles when traveling along the north-south roadway. The second control signal continues for a predetermined time after the detector 16 ceases to detect the optical energy signals which initiated the control signal. The conductors 20 and 22 are connected to a priority and phase selection control circuitry 24** of the remote control system.

The remote control system includes similar circuitry for the control of traffic along the east-west roadway. Such circuitry includes a second detector means, shown as the directional optical detector 26, and third and fourth signal discriminator circuits **18.1*a* and 18.1*b*, respectively, which are a part of the signal discriminator means 18. The signal discriminator circuit 18.1*a* provides a third control signal on conductor 30 in response to detection by the detector 26 of any one of at least two different predetermined optical energy signals selected to be transmitted from the selected vehicles when traveling along the east-west roadway of the intersection. The signal discriminator circuit 18.1*b* provides a fourth control signal on conductor 32 in response to detection by the detector 26 of a predetermined one of the possible optical energy signals selected to be transmitted from the selected vehicles. The fourth control signal continues for a predetermined time after the detector 26 ceases to detect the optical energy signals which initiate the control signal. The conductors 30 and 32 are connected to the priority and phase selection circuitry 24**.

Figure 2:
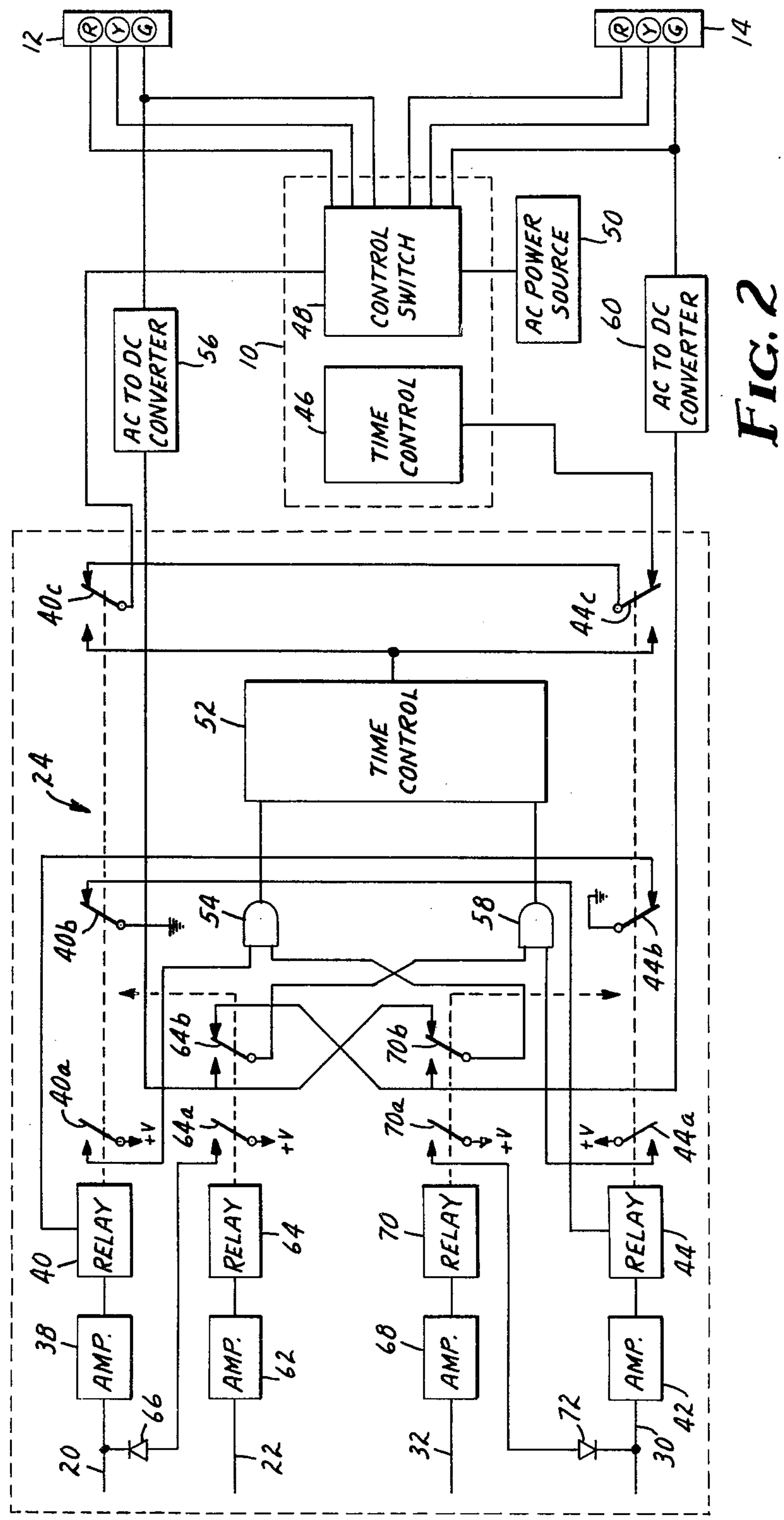
FIG. 2 is a block diagram with some circuit detail given that illustrates more specifically the phase and priority selection circuitry and traffic signal controller of FIG. 1.

FIG. 2 shows details of the priority and phase selection control circuitry 24 together with further details regarding the traffic signal controller 10. An amplifier 38 receives any control signal provided by the signal discriminator means 18 on conductor 20 which is amplified and applied to energize a switching means provided by a relay 40 having three movable contacts **40*a*, 40*b* and 40*c*. An amplifier 42 is connected to receive any control signal provided by the signal discriminator means 18 on conductor 30 which is amplified and applied to a switching means provided by a relay 44 having three movable contacts 44*a*, 44*b* and 44*c*. When relay 40 is not energized, the contact 40*b*, which is connected to ground, is in contact with its fixed contact which is connected to relay 44. Similarly, when relay 44 is not energized, contact 44*b*, which is connected to ground, is in contact with its fixed contact which is connected to relay 40. With this arrangement, relay 40 cannot be energized if relay 44** is already energized and vice-versa.

Two basic components of any traffic signal controller, such as controller 10, include a time control 46 and a control switch 48 which is normally operated in accordance with the timing provided by the time control 46. The control switch 48 is connected to an A.C. power source 50 and serves to provide the necessary switching of the A.C. power to sequentially energize the traffic lights 12 and 14 in the usual manner. The priority and phase selection control circuitry 24 includes a time control 52 which provides timing signals at its output at a faster rate than those provided by the time control 46. The switch means provided by relay 40 and the switch means provided by relay 44 are used to control the connection of the time control 46 and time control 52 to the control switch 48. The output of the time control 52 is connected to a fixed contact associated with the movable contact 40*c* and to a fixed contact associated with the movable contact 44*c*. The movable contact 40*c* is connected to the control switch 48 of controller 10 and is in contact with a fixed contact when relay 40 is not energized with such fixed contact connected to the movable contact 44*c*. The movable contact 44*c* is in contact with a fixed contact when relay 44 is not energized with such fixed contact connected to the time control 46 of controller 10.

With such circuit arrangement provided between the time control 52 and the control switch 48 and between the time control 46 and the control switch 48, the traffic controller 10 will normally be operating under the control of the time control 46 when neither of the relays 40 and 44 are energized. In the event relay 40 (44) becomes energized, the output of the time control 52 is applied to the control switch 48 to place the operation of the traffic lights 12 and 14 under the control of the time control 52. During the time that relay 40 (44) is energized, relay 44 (40) cannot be energized since the ground connection needed for relay 44 (40) via the contact 40*b* (44*b*) will be removed.

The presence of a control signal on conductor 20 indicates an optical energy signal has been detected by the optical detector 16 and recognized by the signal discriminator means 18. In order that the vehicle which transmitted the detected optical energy signal can have a green light presented to it quickly so it may pass safely through the intersection, it is desirable that the control switch 48 be operated at the faster timing rate provided by time control 52 to shorten the time required to provide a green light at the traffic signal 12 for the vehicle initiating the detected signal. The circuitry described to this point provides this action. Further circuitry, however, is needed to disable the time control 52 once the green light has been energized so the green light will remain energized for the duration of the control signal applied to the amplifier 38, which duration is arranged to be of a sufficient length to allow the control initiating vehicle to pass through the intersection. The time control 52 is arranged so that a logic 1 signal obtained from the AND gate 54 will disable the time control 52. The movable contact 40*a* is connected to a positive voltage source which is applied to one input of the AND gate 54 when relay 40 is energized to bring the movable contact 40*a* in contact with its fixed contact. A positive voltage will appear at the other input to the AND gate 54 when the green light for the traffic light 12 is energized, since the green light is connected to the other input to AND gate 54 via an A.C. to D.C. converter 56. The time control 52 is thus disabled when relay 40 is energized and the green light for traffic light 12 is energized. Upon termination of the control signal that was presented to the amplifier 38, the relay 40 is de-energized causing the time control 46 to once again be connected via the relay contacts 40*c* and 44*c* to the control switch 48 to cause the traffic control system to again be operated in the normal manner. Circuit action similar to that just described is provided when relay 44 is energized due to a control signal on conductor 30. AND gate 58 is connected in a similar fashion to the time control 52 with one input of the AND gate 58 connected to the fixed contact for the movable contact 44*a* that is connected to a positive voltage source. The other input to AND gate 58 is connected to the green light for the traffic light 14 via an A.C. to D.C. converter 60.

If the remote control system described up to this point did not provide for possible control signals on conductors 22 and 32, vehicles having optical energy signal transmitters would obtain the control of the traffic control system at an intersection on a first-come, first-serve basis. The provision for the control signals on conductors 22 and 32 from the signal discriminator means 18 is required together with the remaining circuitry in FIG. 2 to provide a remote control system whereby vehicles transmitting the particular optical energy signal that is detected by one of the detectors 16 and 26 to which the discriminator means 18 responds to provide a control signal on conductor 22 or 32 which is effective to cause the remote control system to control the traffic control system even though a control signal may have been received already by either amplifier 38 or 42. As between the control signals produced on conductors 22 and 32 from discriminator means 18, such signals, as will be explained in connection with the detailed explanation given for the signal discriminator circuit 18*b*, are effective to obtain control of the traffic control system on a first-come, first-serve basis. Referring to FIG. 2, control signals via the conductor 22 are applied to an amplifier 62 which has its output connected to a relay 64 having movable contacts 64*a* and 64*b* which appear in FIG. 2 and movable contact 64*c* which is shown in FIG. 1 serving to connect the output of the optical detector 26 to that portion of the signal discriminator means 18 that is connected to conductor 30. The movable contact 64*a* is normally open and is connected to a positive voltage source. When movable contact 64*a* is moved to its closed position, the positive voltage source is connected via a diode 66 to the input of amplifier 38. The movable contact 64*b* is connected to one of the inputs for AND gate 58 and operates between two fixed contacts. When relay 64 is not energized, the contact 64*b* is in contact with one of the fixed contacts and, in such position, serves to connect the converter 60 to the one input of AND gate 58. The other fixed contact for movable contact 64*b* is connected to converter 56 causing the converter 56 to be connected to one input of AND gate 58 via the contact 64*b* when relay 64 is energized. The control signals provided on conductor 32 are applied to amplifier 68 which is connected to control the operation of relay 70. As in the case of relay 64, relay 70 has two movable contacts 70*a* and 70*b* which are shown in FIG. 2 plus movable contact 70*c* which is shown in FIG. 1 serving to connect the output of the optical detector 16 to that portion of the signal discriminator means 18 that is connected to conductor 20. Movable contact 70*a* is normally open and connects to a positive voltage source. Upon closure, contact 70*a* serves to connect the positive voltage source to the input of amplifier 42 via a diode 72. The contact 70*b* is connected to one input of the AND gate 54 and operates between two fixed contacts. When relay 70 is not energized, contact 70*b* is in contact with one of the fixed contacts and in such position serves to connect the converter 56 to the one input of AND gate 54. The other fixed contact associated with contact 70*b* is connected to the converter 60 causing the converter 60 to be connected to the input of AND gate 54 when relay 70 is operated.

A more complete appreciation of the operation of the remote control system that has been described to this point will be gained by considering its operation in response to some of the possible signal situations that can be encountered. One situation, which will be considered, is the detection of an optical signal from a vehicle traveling along the north-south (east-west) roadway for the intersection giving rise to a control signal on conductor 20 (30). A second situation involves the detection of an optical signal from a vehicle traveling along the north-south (east-west) roadway for the intersection giving rise to a control signal on conductor 22 (32). A modification of the first situation, assuming a vehicle on the north-south (east-west) roadway causes a control signal to be presented on conductor 22 (32), involves the subsequent detection of an optical signal from a vehicle traveling along the east-west (north-south) roadway giving rise to a control signal on conductor 32 (22), which may occur either before the green light for traffic light 12 (14) has been energized or after the green light for traffic light 12 (14) has been energized.

In the case of the first situation to be considered, the detection of an optical signal from a vehicle traveling along one of the roadways, e.g., the north-south (east-west) roadway, gives rise to a control signal on conductor 20 (30) causing the relay 40 (44) to be energized. Contact 40*b* (44*b*) is moved to its open position to remove the ground from relay 44 (40) causing the remote control system to be disabled with respect to any control signal that might subsequently appear on conductor 30 (20) from the signal discriminator means 18. Contact 40*a* (44*a*) moves to its closed position to cause a logic 1 signal to be presented to one input of the AND gate 54 (58). Contact 40*c* (44*c*) operates to disconnect the time control 46 of the traffic signal controller 10 from the control switch 48 and connect the output of the time control 52 to the control switch 48. The timing signals provided from the time control 52 serve to increase the speed at which the control switch 48 is operated for changing the lights at the traffic lights 10 and 12. When the green light for traffic light 12 (14) is energized, a logic 1 signal is applied to the other input of the AND gate 54 (58) via the converter 56 (60) and the closed contact 70*b* (64*b*) causing the AND gate 54 (58) to present a logic 1 signal to the time control 52 to terminate flow of timing signals to switch 48. This action causes the green light for the traffic light 12 (14) to remain energized until such time as the relay 40 (44) is de-energized which occurs upon termination of the control signal on conductor 20 (30). The duration of the signal on conductor 20 (30) is arranged to be of a length sufficient to enable the vehicle, which gave rise to the control signal on conductor 20 (30) to pass through the intersection under the control of the green light at the traffic light 12 (14).

In the case of the second situation to be considered, a vehicle on one of the roadways of the intersection, e.g., the north-south (east-west) roadway, may be one which provides an optical signal giving rise to a control signal on conductor 22 (32). A signal on conductor 22 (32) energizes relay 64 (70) causing closure of the contact 64*a* (70*a*) to apply a positive signal to the amplifier 38 (42) to energize relay 40 (44). The operation of the priority and phase selection circuitry 24 is then as was just described in the case of the presentation of the control signal on conductor 20 (30), except that control is transferred back to the time control 46 of controller 10 when the relay 40 (44) is de-energized in response to the de-energization of relay 64 (70) due to termination of the control signal on conductor 22 (32). The duration of the control signal appearing on conductor 22 (32) is sufficient to permit the vehicle giving rise to such control signal to pass through the intersection under the control of the green light for traffic light 12 (14). While the contact 64*b* (70*b*) of relay 64 (70) is actuated, it does not have any influence regarding the operation of the circuitry 24 for this particular situation. The energization of relay 64 (70) does, however, cause contact 64*c* (70*c*), which controls the application of the output from optical detector 26 to the discriminator means 18, to be actuated to the open position thereby preventing any control signal from appearing on conductor 30 (20).

As has been indicated, a situation may arise wherein the initial control signal to be presented to the circuitry 24 may be one appearing on conductor 20 (30) in response to the detection of an optical signal from a vehicle traveling along one of the roadways of the intersection, e.g., the north-south (east-west) roadway, with a control signal subsequently being presented on conductor 32 (22) in response to detection of an optical signal from a vehicle traveling along the east-west (north-south) roadway of the intersection. It is possible that the control signal appearing on conductor 32 (22) may occur before the green light for traffic light 12 (14) has been energized in response to the control signal on conductor 20 (30). If such is the case, relay 40 (44) will be initially energized by the signal on conductor 20 (30) to cause the circuitry 24 to be conditioned to place the operation of the control switch 48 under the time control 52 which operation would normally cease when the green light at the traffic light 12 (14) is energized. Such action to terminate will not occur when a control signal is received on conductor 32 (22), before the green light for traffic 12 (14) is energized, to cause relay 70 (64) to be energized. Though closure of contact 70*a* (64*a*) applies a positive voltage to the input of amplifier 42 (38), relay 44 (40) is not energized, since the ground connection for relay 44 (40) was removed when relay 40 (44) was operated. The actuation of contact 70*b* (64*b*) is effective to connect the converter 60 (56) to one input of AND gate 54 (58). Since relay 40 (44) is energized, the other input to AND gate 54 (58) has a logic 1 signal applied to it via the relay contact 40*a* (64*a*). When the green light for traffic light 14 (12) is energized via the control switch 48 operating under the time control 52, a logic 1 signal is applied to AND gate 54 (58) via the converter 60 (56) and contact 70*b* (64*b*) causing a logic 1 signal to be presented at the output of AND gate 54 (58) to terminate operation of the time control 52. The green light for traffic light 14 (12) remains energized until such time as the controller 10 assumes control, which occurs once the control signal on conductor 20 (30) and the control signal on conductor 32 (22) is removed. The situation just described involves a priority control situation. The control of the traffic lights 12 and 14 was initially assumed by a control signal on conductor 20 (30) initiated by a vehicle traveling along the north-south (east-west) roadway of the intersection with a control signal on conductor 32 (22) subsequently initiated by a vehicle traveling the east-west (north-south) roadway of the intersection assuming and maintaining control of the priority and phase selection circuitry 24 to cause a green light to be presented at the traffic light 14 (12) giving priority to the vehicle traveling the east-west (north-south) roadway.

In the situation just described, where a control signal is initially presented at conductor 20 (30), it is possible that a control signal on conductor 32 (22) due to detection of a signal from a vehicle traveling the east-west (north-south) roadway may be presented after the green light for traffic light 12 (14) has been energized. A control signal on conductor 32 (22) is effective to operate relay 70 (64). Prior to the operation of relay 70 (64), the AND gate 54 (58) provides a logic 1 signal at its output to terminate the flow of time signals from the time control 52, since the green light for traffic light 12 (14) was energized to provide one input to AND gate 54 (58) with a logic 1 signal from converter 56 (60) via contact 70*b* (64*b*) of relay 70 (64). Upon energization of relay 70 (64), the contact 70*b* (64*b*) is moved to open the circuit from converter 56 (60). The operation of contact 70*b* (64*b*) serves to connect the converter 60 (56) associated with the green light of traffic light 14 (12) to one input of AND gate 54 (58). Since the green light of traffic signal 14 (12) is not energized, the AND gate 54 (58) presents a logic 0 signal to time control 52 allowing time control 52 to again provide time signals to control the operation of control switch 48 to energize the lights for traffic lights 12 and 14 in sequence at a rate determined by time control 52. When a green light is presented at the traffic light 14 (12), AND gate 54 (58) receives a logic 1 signal via converter 60 (56) and contact 70*b* (64*b*) to cause the AND gate 54 (58) to present a logic 1 signal to terminate the flow of time signals from time control 52. As before, the control of the traffic lights 12 and 14 are returned to the timer 46 of controller 10 once the signals on conductors 22 and 32 are removed. It should also be appreciated that relay contacts 70*c* (64*c*) are operated when relay 70 (64) is energized to prevent any signal then detected by the optical detector 16 (26) from producing a control signal on conductor 20 (30).

Except for establishing the functional requirements for the signal discriminator circuits 18*b* and 18.1*b* of the discriminator means 18, no details have been provided with respect to circuitry capable of meeting such requirements. Details of the circuitry suitable for use as the signal discriminator circuits 18*a* and 18*b* of the signal discriminator means 18 will be discussed. The same type of circuitry can be used for the signal discriminator circuits 18.1*a* and 18.1*b* of the discriminator means 18 as is shown in FIG. 1 and is identified by the use of the same reference numerals used for the signal discriminator circuits 18*a* and 18*b* with such reference numerals increased by 0.1.

The signal discriminator circuit 18*b* includes an amplifier-integrator circuit 11 connected to receive any signal from the output of optical detector 16. The optical signals transmitted by the selected vehicles are of at least two possible frequencies with only one of the two optical signals satisfying the selection process provided by the discriminator circuit 18*b*. The optical signal capable of being detected by the discriminator 18*b* must be provided by an optical energy emitter wherein the frequency is carefully controlled, preferably by a crystal controlled timer. An optical signal having a frequency of 14.035 Hz is usable which provides a repetition rate of 71.25 milliseconds. Each signal transmitted by an optical energy emitter for initiating a control signal is a damped pulse signal of approximately 60 microseconds duration. Detectors 16 and 26 may take the form of the detector that is disclosed in U.S. Pat. No. Re. 28100.

The signal detected by detector 16 is applied to the amplifier-integrator circuit 11 which amplifies and integrates the detected signal thereby serving to determine whether the detected signal has a desired energy content before the signal is recognized for further processing and, thus, distinguish the detected signal from lower energy level signals which may be detected. The output of the amplifier-integrator 11 is applied to a range control and pulse stretcher circuit 13 which provides a signal for further processing when the signal from the amplifier-integrator 11 is of the magnitude required by the range control portion of circuit 13. The pulse stretcher portion of circuit 13 is used to increase the duration of the signal from the range control portion so it is almost as long as a pulse cycle provided by a timing pulse generator 19.

The remainder of the circuitry for the signal discriminator circuit 18*b* includes an input synchronizing circuit 15, a signal coincidence circuit 21, a signal counter circuit 23 and a signal latch circuit 29, plus circuitry used in common with the signal discriminator circuit 18.1*b* which includes a delay circuit 17, a signal cancel counter circuit 25, a reset signal circuit 27, a signal drop-out timer 31 and a multiphase non-overlapping timing pulse generator 19.

Figure 3:
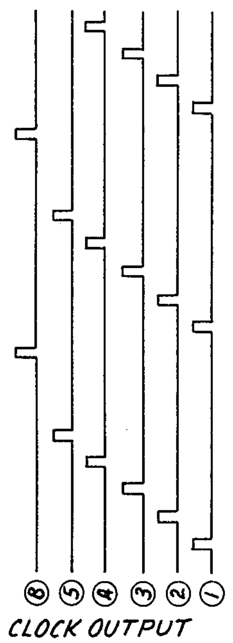
FIG. 3 shows the multiphase clock pulses that are provided by the clock generator of FIG. 1.

The timing pulse generator 19 provides six timing phases. Timing phases that are suitable are shown in FIG. 3. The cycle time for each time phase is related to the repetition rate of the optical signal to be discriminated in that it can be evenly divided into such repetition rate. In the case of the suggested usable repetition rate 71.25 milliseconds, a suitable cycle time can be 1.25 milliseconds. Thus, 57 timing pulses in any one timing phase are produced between optical signals provided at such repetition rate. Referring to FIG. 1, the numbers appearing in a circle positioned adjacent the various circuit portions of the discriminator circuits 18*a* and 18.1*b* identify the various timing phase pulses from generator 19 that are used with such circuit portions.

Each signal from circuit 13 is applied to the input synchronizing circuit 15 which serves to synchronize the operation of the circuit 15 with the operation of the delay circuit 17. The input synchronizing circuit 15 is structured so that a signal from circuit 13 is entered by a pulse of timing phase 5 and is applied to the delay circuit 17 and to a coincidence circuit 21 by a pulse of timing phase 8. A signal applied to the delay circuit 17 is delayed by a time equal to the repetition rate of the optical signal to be discriminated, which, in the case of the frequency that has been suggested, is 71.25 milliseconds. With such repetition rate and timing pulses with a 1.25 millisecond cycle, the delay circuit 17 may utilize a shift register which requires 56 timing pulses to shift an input through the register. The delay circuit 17 may be structured so the signal from the input synchronizing circuit is shifted through a shift register in response to pulse of timing phase 4 with a pulse of timing phase 1 used to provide a logic 1 at the output of the delay circuit 17 when the delayed signal is produced at the output of the shift register with such logic 1 remaining until the delay circuit 17 is reset.

If a signal from the input synchronizing circuit 15 is received at coincidence circuit 21 at the same time that the delay circuit 17 provides a signal to circuit 21, the two signals are considered to have originated from the same source. A check is made for coincidence in accordance with the timing pulses. For the coincidence circuit 21 shown in FIG. 1, such check is made when a phase 2 timing pulse is presented. Upon the occurrence of coincidence, an output from the coincidence circuit 21 is applied as an input signal counter 23 to increase its count by one. The counter 23 provides an output signal upon receiving a predetermined number of consecutive input signals. Nine consecutive input signals have been found sufficient for providing the level of signal discrimination that is needed.

The signal cancel counter 25 is provided for the purpose of establishing a short time period during which a coincidence can occur to allow for any small changes in the frequency of the emitter signal. The signal cancel counter 25 receives the output from the delay circuit 17 and while it is present provides a time period for a coincidence to occur before the counter 25 provides a reset signal to the signal counter 23 to require that it again initiate the required count of consecutive input signals to the signal counter. A time period equal to three to four time pulses is adequate. A count is entered into the counter 25 by phase 2 time pulses with any reset signal output provided during a phase 4 timing pulse.

Extraneous light sources can be encountered at times which give rise to input signals to the delay circuit 17 and the coincidence circuit 21. It is necessary that such input signals from extraneous light sources not give rise to a number of output signals from the coincidence circuit 17, since such a situation could result in the presentment of a control signal on conductor 22 that would not be desired. It is important, therefore, that means be provided for preventing the appearance of a control signal on conductor 22 as a result of such a situation. This can be done by providing a means that is responsive to a signal from the coincidence circuit 21 indicating the occurrence of coincidence which is effective to prevent the coincidence circuit 21 from providing another coincidence indicating signal for a time period equal to the delay time of the delay circuit 17. One arrangement for providing this function includes the reset signal circuit 27 which is connected to the output of the coincidence circuit 21 and in response to a coincidence indicating output signal from the coincidence circuit provides a reset signal to the delay circuit 27. The reset signal circuit 27 receives phase 3 and 4 time pulses for conditioning the circuit 27 for the entry of the output from the coincidence circuit 21 and presentment of a reset signal to the delay circuit 17. The reset signal is also applied to the signal cancel counter 25 to reset it. Another suitable arrangement providing a solution to the extraneous light source problem involves blanking of the signal inputs to the delay circuit 17 and the coincidence circuit 21 in response to a coincidence indicating output from the coincidence circuit 21 with such blanking being provided for a time period equal to the delay time of the delay circuit 17.

The discrimination function of the discriminator circuit **18*b* is completed when an output is obtained from the signal counter circuit 23 in response to the detection of nine consecutive optical pulses supplied at the proper frequency. It is necessary, however, that provision be made to apply such output as a control signal on conductor 22 and maintain it for a period of time that is sufficient to allow for possible periods of interruptions in the signal path between the transmitting vehicle and the detector 16 with such time also being sufficient to enable the vehicle, once the signal path is lost as the vehicle nears or enters the intersection, to proceed safely through the intersection. The signal latch circuit 29, which is connected to the output of the signal counter circuit 23, provides a control signal on conductor 22 in response to an output from the signal counter circuit 23. Entry of the output from the signal counter circuit 23 into the signal latch circuit 29 is made upon receipt of a phase 5 timing pulse. The signal latch circuit 29 is structured so that the control signal on conductor 22 that is provided in response to an output from the signal counter circuit 23 remains until such time as the signal latch circuit 29 is reset. The signal drop-out timer 31 in response to phase 1 timing pulses provides a time period which is initiated at the time the signal from the signal counter circuit 23 is entered into the signal latch circuit 29. Upon completion of the time period provided by the signal drop-out timer 31 and in response to a phase 3 timing pulse, the timer 31 provides a reset signal to the signal latch circuit 29 causing the control signal on conductor 22 to be removed. A time period for the timer 31** of about six seconds has been found to be sufficient for the purpose mentioned above.

It is desirable that the two signal discriminator circuits **18*b* and 18.1*b* operate so that a control signal provided on conductor 22 or conductor 32 assumes control of the priority and phase selection control circuit 24 on a first-come, first-serve basis. It is possible to use connections between the signal latch circuit 29 and the signal latch circuit 29.1 to provide a logic signal on the interconnecting conductor 33 when the signal latch circuit 29 is presenting a control signal on conductor 22 to disable the signal latch circuit 29.1. Similarly, a logic signal is provided on interconnecting conductor 35 to disable the signal latch circuit 29 when the signal latch circuit 29.1 is providing a control signal on conductor 32. It is also recognized that such first-come, first-serve feature with respect to control signals on conductors 22 and 32 can also be provided in a manner similar to that implemented in the priority and phase selection circuitry 24 with respect to establishing a first-come, first-serve feature regarding the control signals on conductors 20 and 22** which has been discussed.

The signal discriminator circuits **18*a* and 18.1*a* can be of the form described for discriminator 18*b* except that use of such a discriminator for circuits 18*a* and 18.1*a* requires the circuit to be arranged to recognize optical signals transmitted at a repetition rate different from that used in connection with circuits 18*b* and 18.1*b*. It is also possible to use a discriminator circuit of the type disclosed in U.S. Pat. No. 3,831,039 to Henschel. The discriminator circuit described in the patent to Henschel is not as selective as the discriminator circuit 18*b* that has been described. A discriminator circuit constructed in accordance with the teachings of Henschel is capable of responding to signals obtained from the detection of optical signals generated for detection and processing by discriminators 18*b* and 18.1*b* as well as optical signals having a repetition rate different from that of the optical signals to be recognized by discriminator circuits 18*b* and 18.1*b***.

Figure 4:
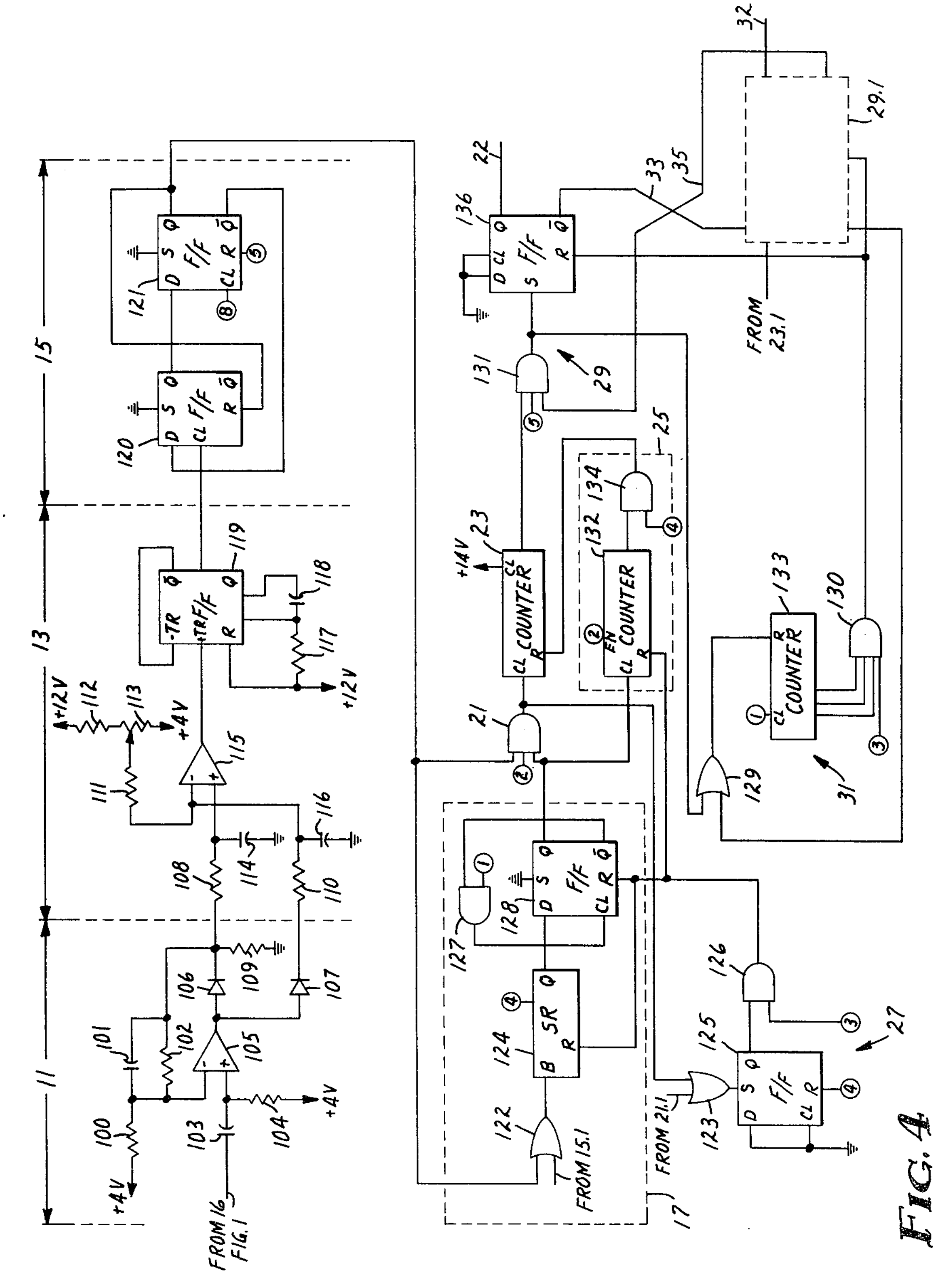
FIG. 4 shows exemplary circuits for most of the circuit portions shown in block form in FIG. 1.

Exemplary circuits for each of the circuit portions shown in block form for the discriminator **18*b* are set forth in detail in FIG. 4. Exemplary circuits for those circuit portions common to discriminator circuit 18*b*** and 18.1*b* are also shown in FIG. 4. Referring to the OR gate 122 of the delay circuit 17, the unconnected input to the OR gate is used to receive an input from the input synchronizing circuit 15.1, which is a part of the discriminator circuit 18.1*b*. Similarly the OR gate 123 of reset signal circuit 27 is shown in FIG. 4 with one input not connected. This unconnected input is for connection to the output of the coincidence circuit 21.1 of the discriminator circuit 18.1*b*. The signal latch circuit 29.1 of the discriminator circuit 18.1*b* is shown by the block formed by a dotted line and is included in FIG. 4 in order to show the interconnections provided between the signal latch circuit 29 and the signal latch circuit 29.1 for providing a first-come, first-serve operation with respect to control signals on conductors 22 and 32. No circuit details have been given for the pulse generator 19, since the state of the art regarding pulse generators is such that the description provided with respect to the functions which it must perform are sufficient to enable anyone skilled in the art to provide a pulse generator capable of performing such functions. To complete the exemplary circuits shown in FIG. 4, the value or component type for the various elements of such circuitry, as identified by the reference numerals used in the FIG. 4, is set forth below.

| | |
|---|---|
| Resistors | |
| 112 | 3.3K ohms |
| 100 | 4.7K ohms |
| 104, 109 | 10K ohms |
| 108, 117 | 15K ohms |
| 110 | 100K ohms |
| 102 | 150K ohms |
| 111 | 1M ohm |
| Potentiometer | |
| 113 | 10K ohms |
| Capacitors | |
| 101, 118 | .01 microfarad |
| 114 | .022 microfarad |
| 103 | .1 microfarad |
| 116 | 1 microfarad |
| AND Gate, 2-Input | |
| 126, 127, 134 | SCL4081* |
| AND Gate, 3-Input | |
| 21, 131 | SCL4073* |
| AND Gate, 4-Input | |
| 130 | SCL4082* |
| Binary Counter | |
| 133 | SCL4020* |
| Counter, Decade | |
| 23, 132 | SCL4017* |
| Diodes | |
| 106, 107 | IN914 |
| Flip-Flop, D-Type | |
| 120, 121, 125 128, 135, 136 | SCL4013* |
| Flip-Flop, Monostable | |
| 119 | CD4098(RCA) |
| Operational Amplifier | |
| 105, 115 | CA244(RCA) |
| OR Gate, 2-Input | |

-continued

| | |
|---|---|
| 122, 123, 129 | SCL4071* |
| Variable 1-64 Bit Shift Register | |
| 124 | MC14557(Motorola) |

*Solid State Scientific, Inc.

What is claimed is:

1. A signal discriminating circuit for providing a control signal only in response to a consecutive predetermined number of input signals presented at a predetermined frequency, the circuit including a digital delay circuit;

a coincidence circuit;

an input synchronizing circuit portion for receiving the input signals and having its output operatively connected to the input of said delay circuit and to an input of said coincidence circuit, said delay circuit having its output operatively connected for providing an input signal to said coincidence circuit, said coincidence circuit portion providing a coincidence indicating signal each time coincidence occurs between a signal from the output of said synchronizing circuit portion and a signal from the output of said delay circuit portion.

means operatively connected to said coincidence circuit and said delay circuit and responsive to one of said signals from the output of said coincidence circuit for preventing said coincidence circuit from providing another one of said signals at its output for a time period equal to the delay time of said delay circuit;

a signal counter operatively connected to the output of said coincidence circuit, each signal from the output of said coincidence circuit increasing the count of said signal counter by one, said signal counter providing the control signal whenever a consecutive predetermined number of signals from said coincidence circuit is received; and a pulse generator connected for providing timing pulses to said input synchronizing circuit, said digital delay, said coincidence circuit, and said means operatively connected to said coincidence circuit and said delay circuit.

2. A signal discriminating circuit in accordance with claim 1 and further including a signal cancel counter operatively connected to the output of said delay circuit, said signal counter and said pulse generator for resetting said signal counter in the event said coincidence circuit, when an input signal is received from said delay circuit, fails to provide an output signal within a period of time that is less than the delay time of said delay circuit.

3. A signal discriminating circuit in accordance with claim 1 wherein said means is also operatively connected to said signal cancel counter for resetting said signal cancel counter when said means responds to one of said signals from the output of said coincidence circuit.

* * * * *